(12) United States Patent
Loh et al.

(10) Patent No.: US 7,437,694 B1
(45) Date of Patent: Oct. 14, 2008

(54) SYSTEM AND METHOD FOR DETERMINING AND IDENTIFYING SIGNALS THAT ARE RELEVANTLY DETERMINED BY A SELECTED SIGNAL IN A CIRCUIT DESIGN

(75) Inventors: Lawrence Loh, Milpitas, CA (US); Chung-Wah Norris Ip, Fremont, CA (US); Soe Myint, Santa Clara, CA (US)

(73) Assignee: Jasper Design Automation, Mountain View, CA (US)

( * ) Notice: Subject to any disclaimer, the term of this patent is extended or adjusted under 35 U.S.C. 154(b) by 709 days.

(21) Appl. No.: 11/063,399

(22) Filed: Feb. 22, 2005

(51) Int. Cl.
*G06F 17/50* (2006.01)
(52) U.S. Cl. .................... 716/5; 716/4; 716/6
(58) Field of Classification Search ............. 716/5, 716/4, 6
See application file for complete search history.

(56) References Cited

U.S. PATENT DOCUMENTS

| | | | | |
|---|---|---|---|---|
| 5,422,833 | A * | 6/1995 | Kelem et al. ............... | 703/14 |
| 5,657,239 | A * | 8/1997 | Grodstein et al. .......... | 716/6 |
| 6,240,376 | B1 * | 5/2001 | Raynaud et al. ........... | 703/15 |
| 7,137,078 | B2 * | 11/2006 | Singhal et al. ............. | 716/1 |
| 7,159,198 | B1 * | 1/2007 | Ip et al. .................... | 716/5 |

\* cited by examiner

*Primary Examiner*—Sun J Lin
(74) *Attorney, Agent, or Firm*—Fenwick & West LLP (57) ABSTRACT

A system and method for identifying, for a selected signal, those signals whose value is relevantly determined based upon a value of the selected signal, where a set of signals to be examined is identified as those signals that satisfy one or more of the following criteria: (1) they are RTL load signals of the selected signal, (2) they are RTL load signals that are also in an analysis region, (3) they are RTL load signals within the analysis region that also contribute to a proof target, and/or 4) they are RTL load signals that contribute to the proof target. In one embodiment of the present invention the selected signal at a selected time step relevantly determines a target signal at an associated time step if one of the following items is true: (1) if the value of the selected signal at the selected time step changes (from 0 to 1 or from 1 to 0), the value of the target signal must change, or (2) if the value of the selected signal does not change, the value of the target signal at its associated time step cannot change regardless of how the rest of the inputs to the logic driving the target signal changes. Another embodiment of the present invention, the selected signal at the selected time step relevantly determines a target signal at an associated time step if the value of the selected signal at the selected time step were different then the value of the target signal at the associated time step would be different.

19 Claims, 11 Drawing Sheets

SYSTEM AND METHOD FOR DETERMINING AND IDENTIFYING SIGNALS THAT ARE RELEVANTLY DETERMINED BY A SELECTED SIGNAL IN A CIRCUIT DESIGN

RELATED APPLICATIONS

This application is a related to U.S. patent application Ser. No. 10/401,315 filed on Mar. 27, 2003 which is incorporated by reference herein in its entirety.

FIELD OF THE INVENTION

The present invention relates generally to the field of functional verification of digital circuit designs and more particularly to the field of digital design debugging tools.

BACKGROUND OF THE INVENTION

This invention relates to electronic circuit design tools and methodology (expressed as software) that are typically used to capture the design intent and the specific circuit behavior during the design of a circuit. These tools are also used to communicate the design intent and the circuit behavior between a circuit designer and other technical personnel such as design team member. To make the process easier, textual and graphical tools are embedded in these circuit design tools so as to enhance the understanding and visualization of various aspects of the circuit design. These textual and graphical tools provide an interface in order to display waveforms of various signals and in order to highlight various characteristics that are associated with the circuit design. To display waveforms these tools make use of various kinds of timing waveform diagrams, finite state machine transition diagrams, process flowcharts, etc. Indeed, such graphical representations are standard methods that are currently being used in the circuit design industry. Computer Aided Design (CAD) environments combine the design tools with the graphical tools for this purpose. CAD tools typically provide software-automated environments in order to enable communication between a designer and various kinds of computer-related tools, and by doing so, the designer is able to capture, analyze, and manipulate the design data more effectively and efficiently.

Recently, effort has been directed towards improving the visualization of the circuits and the various parameters guiding the circuit design. This involves display of various waveforms and expressions corresponding to the characteristic of a circuit design. Existing waveform viewers have the ability to display the waveform of the signals and also display corresponding expressions in separate windows. However, the user still has to sift through and understand the plethora of information provided by the waveform. In order to simplify the manual analysis of the waveform, U.S. patent application Ser. No. 10/401,315 filed on Mar. 27, 2003, referenced above, describes a system and process that facilitates this analysis/debugging activity by providing the ability to find out why a signal has a specific value by cross referencing to the source code (the "Why" function). The present invention looks at this analysis/debugging activity from a complementary angle.

Apart from the need to find out "why" a signal has a certain value, there is also a need for information illustrating how signals, which contribute to the violation (or satisfaction) of a property, are affected by a selected signal, e.g., a signal chosen by the user at a specific time step of the waveform. That is, it is important to see how the value of a selected signal at a specific time step affects the surrounding logic with respect to determining the validity of the property. This information is more useful compared to a feature that just shows all signals driven by a selected signal, e.g., the register transfer language (RTL) load. It will aid the user in understanding how the property fails.

In addition, the information presented to the user should be relevant. The selected signal should be directly responsible for the value of the set of surrounding signals which contribute to the validity of the property. In this context, directly responsible means that the selected signal relevantly determines the value of the surrounding signal either in complete conjunction with other inputs (for example, an AND gate where all inputs, including the selected input, are 1) or regardless of other inputs (for example, an AND gate where the selected input is 0).

A variation of the above problem is finding out how the specific value of a selected signal at a specific time step affects surrounding logic, without regard to a property. The user should be able to select a signal, and find all the other signals in which the selected signal at a specific time step is directly responsible for its value. This information is useful to general understanding of the design.

What is needed is a system and method for identifying, for a selected signal, those signals whose value is relevantly determined based upon the value of the selected signal, where the set of signals to be examined is limited to (1) RTL load signals, (2) analysis region signals and/or (3) signals affecting the proof target.

SUMMARY OF THE INVENTION

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

The present invention is a system and method for identifying, for a selected signal, those signals whose value is relevantly determined based upon the value of the selected signal at a specific time step, where the set of signals to be examined is identified as those signals that satisfy one or more of the following criteria: (1) they are RTL load signals of the selected signal, (2) they are RTL load signals that are also in the analysis region, (3) they are RTL load signals within the analysis region that also contribute to the proof target, and/or (4) they are RTL load signals that contribute to the proof target. In one embodiment of the present invention the selected signal relevantly determines a target signal if the value of the selected signal determines the value of the target signal. That is, if the value of the selected signal were different then the value of the target signal may be different.

DETAILED DESCRIPTION OF THE INVENTION

A preferred embodiment of the present invention is now described with reference to the figures where like reference numbers indicate identical or functionally similar elements. Also in the figures, the left most digits of each reference number corresponds to the figure in which the reference number is first used.

Reference in the specification to "one embodiment" or to "an embodiment" means that a particular feature, structure, or characteristic described in connection with the embodiments is included in at least one embodiment of the invention. The appearances of the phrase "in one embodiment" in various places in the specification are not necessarily all referring to the same embodiment.

Some portions of the detailed description that follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations of physical quantities as modules or code devices, without loss of generality.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device, that manipulates and transforms data represented as physical (electronic) quantities within the computer system memories or registers or other such information storage, transmission or display devices.

Certain aspects of the present invention include process steps and instructions described herein in the form of an algorithm. It should be noted that the process steps and instructions of the present invention could be embodied in software, firmware or hardware, and when embodied in software, could be downloaded to reside on and be operated from different platforms used by a variety of operating systems.

The present invention also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and displays presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the present invention as described herein, and any references below to specific languages are provided for disclosure of enablement and best mode of the present invention.

In addition, the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the following claims.

Figure 1:
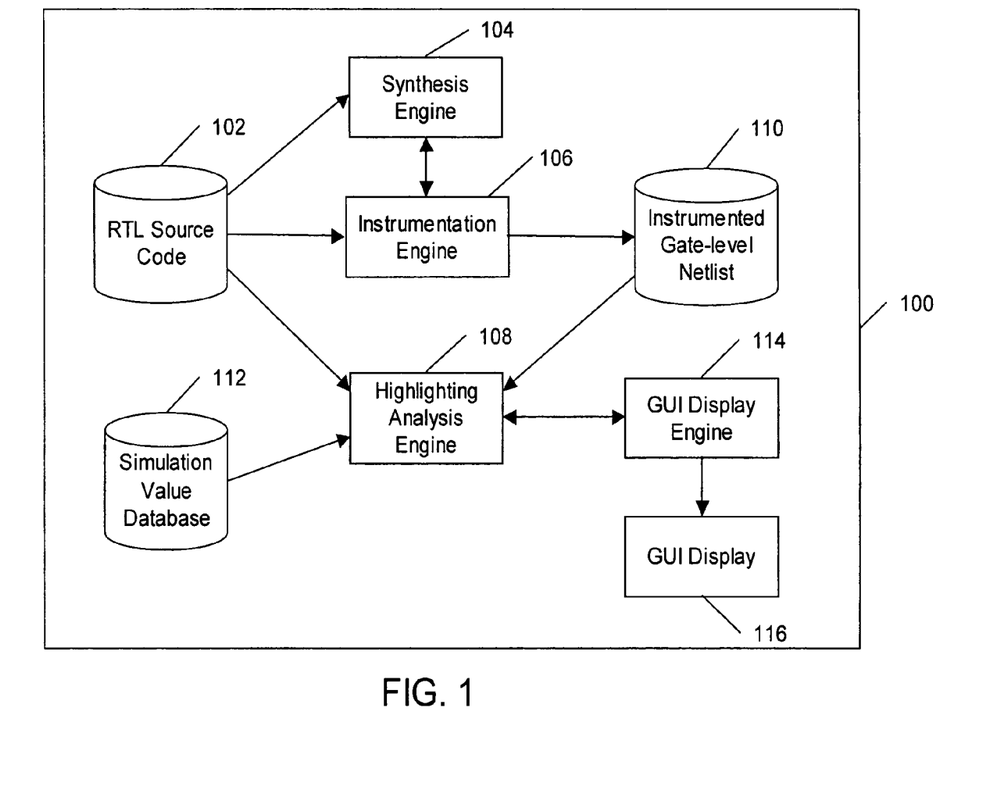
FIG. 1 illustrates a computing environment in which the invention can operate according to one embodiment of the present invention.

FIG. 1 illustrates a computing environment 100 in which the invention can operate according to one embodiment of the present invention. The setup shows an RTL source code 102, a Synthesis Engine 104, an Instrumentation Engine 106, a Highlighting Analysis Engine 108, an Instrumented Gate-level Netlist 110, a Signal Value Database 112, a GUI Display Engine 114 and a GUI Display 116. RTL Source Code 102 describes circuit specification in a high level language. RTL Source Code 102 is simulated (using an RTL-simulator) or formally analyzed (using a formal tool) to generate a Signal Value Database 112. Signal Value Database 112 includes values of signals defined in the circuit specification for a consecutive range of time steps. RTL Source Code 102 is also synthesized to generate a logic network using Synthesis Engine 104. Synthesis Engine 104 is used for converting the high-level specification of the circuit into gate-level netlist. After generating the gate-level netlist, instrumentation is performed on the netlist. This comprises generation of instrumentation data using Instrumentation Engine 106. One embodiment of the present invention instruments the netlist with line and column information for each signal, with respect to where the signal is declared or used in the RTL source code. Instrumentation data along with the gate-level netlist comprise the logic network referred to as Instrumented Gate-level Netlist 110. Signal Value Database 112 and Instrumented Gate-level Netlist 110 are applied to Highlighting Analysis Engine 108. Highlighting Analysis Engine 108 is used to isolate and highlight relevant portions of RTL Source Code 102 corresponding to a signal selected by a user. The isolated and highlighted portions are then displayed on GUI Display 116 using GUI Display Engine 114.

RTL Source Code 102 is written in a hardware description language such as Verilog, VHDL etc. RTL Source Code 102 describes the specification of the circuit in terms of signals and conditions under which the signals are generated. RTL Source Code 102 is verified using an RTL Simulator or formal tool. For this purpose, a model checking tool based on circuit constraints or a simulator based on test bench is used. The verification analysis process results in the generation of the Signal Value Database 112. The Signal Value Database 112 comprises results of verification analysis as well as design data such as component instances, component pins, routing wire connections, etc. Signal Value Database 112 is used to generate a timing waveform of a selected signal using GUI Display Engine 114. Further, Signal Value Database 112 and the instrumented netlist 110 are used to highlight a portion of RTL Source Code 102 that contains the description of the signal. The process of highlighting includes isolating the specific lines and columns of the RTL Source Code 102, which utilizes the selected signal. Within the isolated portion of RTL Source Code 102, the portions responsible for a particular value or transition in value of the signal at the selected time are highlighted. The option of highlighting the portions responsible for a particular value or transition allows the user to browse RTL Source Code 102 interactively and ignore the rest of the source code that is not responsible for the signal value in the selected time. Further, the user can use highlighting to debug the RTL Source Code 102 if there is an error. For instance, if the value of a signal defined in RTL Source Code 102 is not as desired by the user, he/she could interactively browse through RTL Source Code 102 to identify the error. The highlighting analysis engine 108 performs the "why" function described above and the "Because" function described herein.

In contrast to the "why" analysis described above, the "Because" analysis is performed on the selected signal which provides information about how signals, which contribute to the violation or satisfaction of a property, i.e., the proof target, are affected by the selected signal at the specific time step. In other embodiments, the Because feature provides information about how signals are affected by the selected signal at the specific time step where those signals are part of the RTL load and/or are part of the analysis region.

Figure 2:
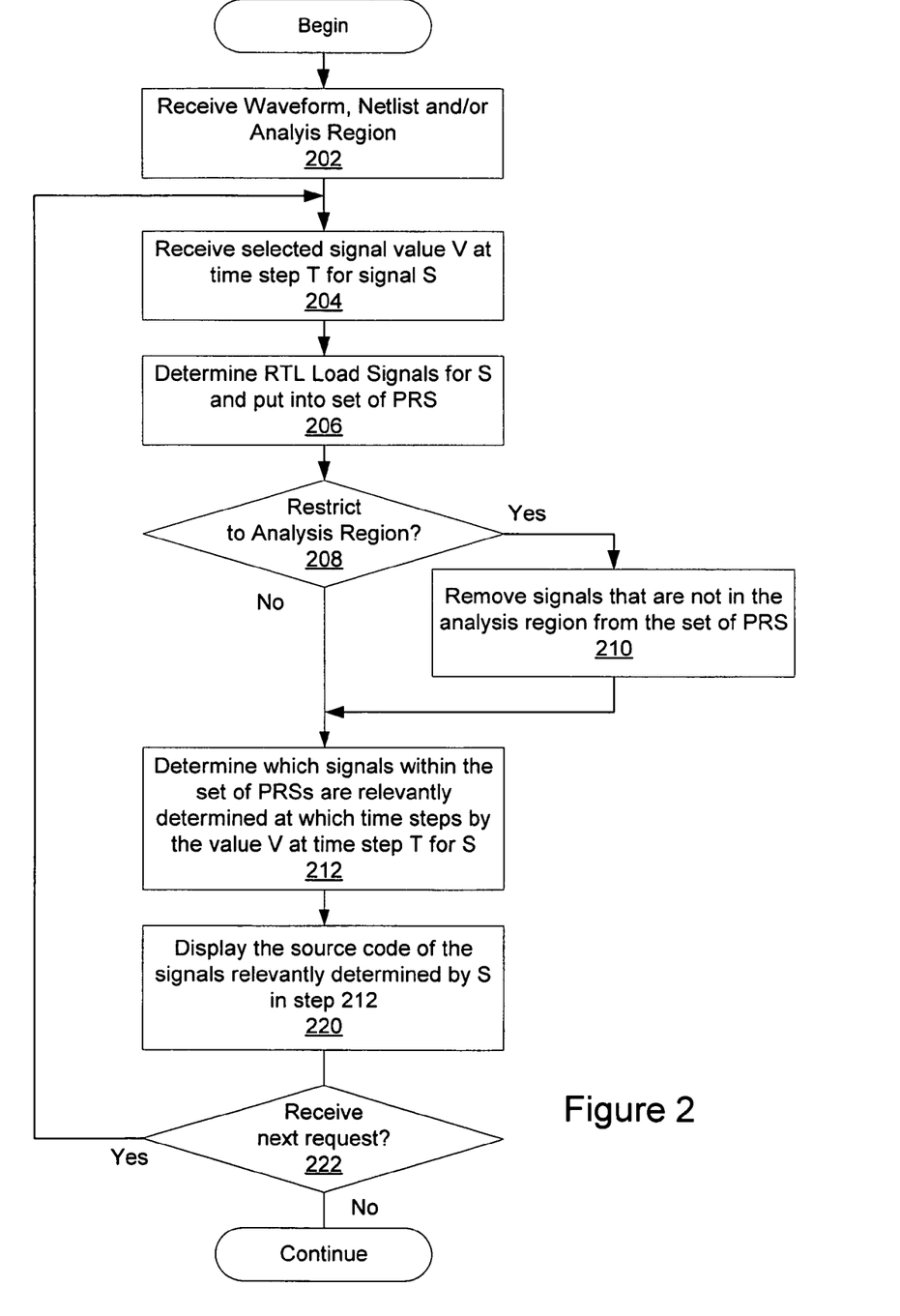
FIG. 2 is a flowchart illustrating a method of the present invention for generating information about values of signals in at least one of the RTL load and within the analysis region that are relevantly determined by a selected signal value according to one embodiment of the present invention.

FIG. 2 is a flowchart illustrating a method of the present invention for generating information about signals in at least one of the RTL load and the analysis region whose values are relevantly determined by a selected signal value according to one embodiment of the present invention. In the present invention a formal verification technique analysis, for example, is used to identify a counterexample. However, this invention is not limited to a specific verification technique (simulation or formal analysis), and is not limited to a specific type of waveforms (counterexample or witness). The present invention receives 202 a waveform and a signal value at a specific time step is selected 204, for example, by the user. The Because analysis 212 is performed on the selected signal value to provide information about how other signals are affected by the selected signal, where those signals are part of the RTL load 206 and/or are part of the analysis region 210. The set of RTL load signals includes all signals driven by the selected signal and is accomplished by tracing the fan-out of the selected signal.

In one embodiment the process determines 208 whether the set of signals to be analyzed should be restricted to the analysis region. If so the process removes 210 signal that are not in the analysis region from the set of PRSs. It will be apparent that step 208 is optional and the decision as to whether the analysis is restricted to the analysis region can be determined prior to implementing the process. A more detailed description of the analysis region is set forth in U.S. patent application Ser. No. 10/389,316 filed on Mar. 14, 2003 and U.S. patent application Ser. No. 10/745,993 filed on Dec. 24, 2003, which are both incorporated by reference herein in their entirety. In one embodiment, the analysis region comprises the following signals: (1) all signals referred to by a proof target (and the assumptions), (2) all signals in the corresponding set of boundary nets, where a "boundary net" is either a primary input or a signal that is used to remove a portion of the design from the formal analysis, and (3) all signals that lie on a signal path between a signal referred to by a property (and assumptions) and a signal in the set of boundary nets.

Once the potentially relevant signals (PRS) are identified as, for example, the signals in the RTL load or the signals in the RTL load that are also in the analysis region the process continues by determining 212 which of the potentially relevant signals are relevantly determined by the selected signal. The process can then display 220 information, e.g., the relevant source code, about these relevantly determined signals at the specific time steps. It may present to the user the lines in the source code where the specific values at the corresponding time steps are assigned to the relevantly determined signals. It may also present to the user the exact lines and columns in the source code in which the selected signal is referred to when determining the values of the relevantly determined signals at the specific time steps. The process can then be repeated 222 for a different selected signal at a different time step. Additional details regarding the process of determining which potentially relevant signals are relevantly determined by the selected signal is set forth in FIG. 4.

Figure 4:
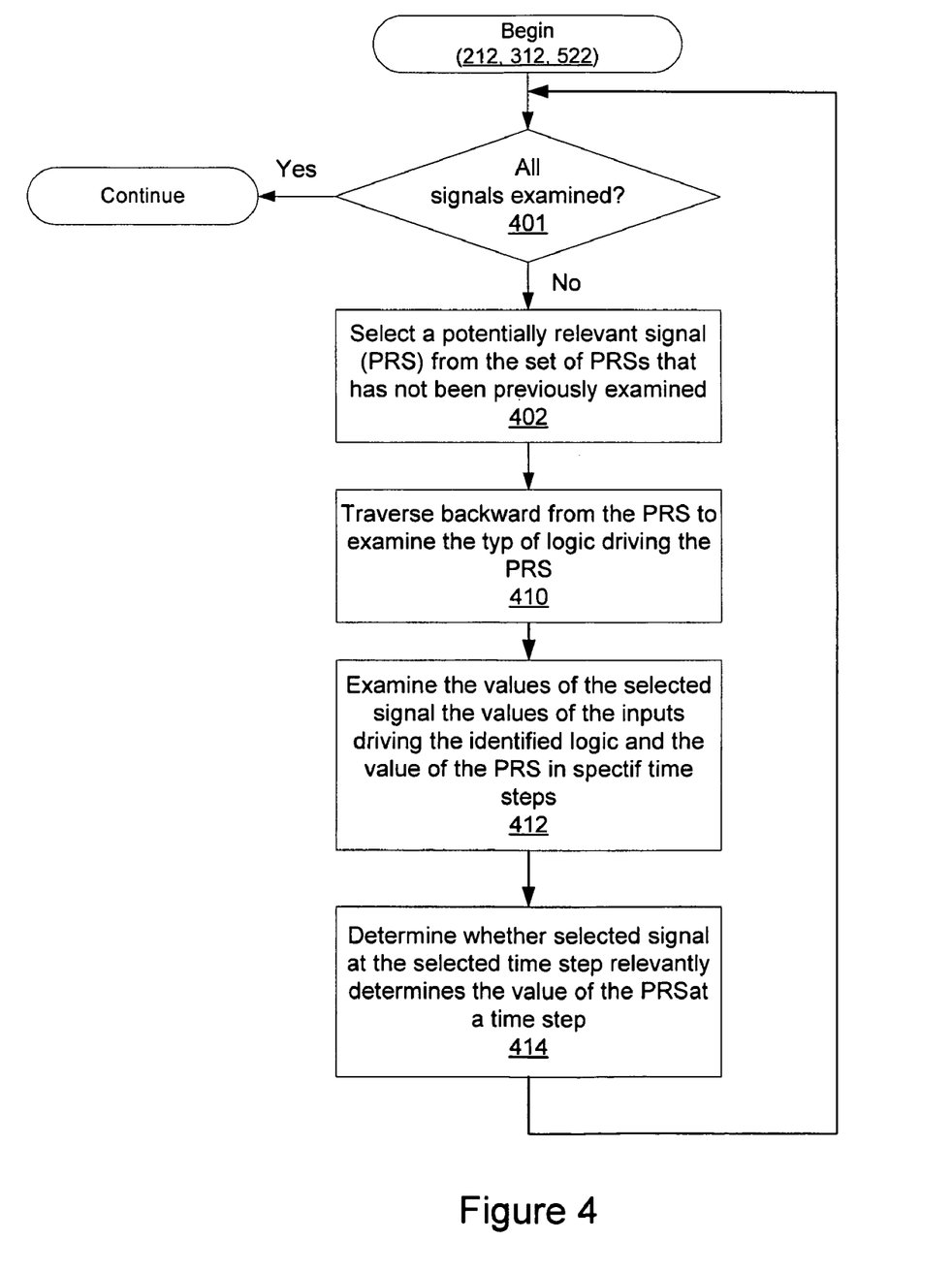
FIG. 4 is a flowchart illustrating a method of the present invention for determining which values of signals from a set of potentially relevant signals is relevantly determined by the selected signal value according to one embodiment of the present invention.

FIG. 4 is a flowchart illustrating a method of the present invention for determining which signal values at specific time steps from a set of potentially relevant signals are relevantly determined by the selected signal at the specific time step according to one embodiment of the present invention. If 401 all signals from the set of PRSs have already been examined then the process ends. Otherwise, the process selects 402 one potentially relevant signal (PRS) from the set of potentially relevant signals. The process then examines 410 the type of logic between the selected signal and the PRS. Examples of the type of logic include an AND gate, OR gate, NAND gate, NOR gate, NOT gate, Multiplexor, state-holding element such as a flipflop, and any combination of these logic gates. The process then examines 412 the values of the selected signal and the selected PRS (and their relationship to the rest of the inputs) and determines 414 whether the selected signal value at the specific time step relevantly determines the value of PRS at some time steps based upon the type of logic.

Identifying whether the selected signal relevantly determines the selected PRS helps isolate those signals so they can be presented to the user by, for example, highlighting the relevantly determined PRSs. This enables the user to more effectively understand how a particular signal affects the counterexample, for example.

In an embodiment of the present invention the selected signal relevantly determines a PRS if one of the following conditions is satisfied: 1) if the value of the selected signal changes (from 0 to 1 or from 1 to 0) while the rest of the inputs stay with the same values, the value of the PRS must change, or 2) if the value of the selected signal does not change, the value of the PRS cannot change regardless of how the rest of the inputs to the logic driving the PRS changes. An alternate embodiment of relevantly determined can be defined to use 1) only without considering 2). Examples of when the values of signals and various types of gates determine whether a selected signal relevantly determines a PRS are described below.

If the logic between the selected signal and the PRS is an AND gate which can be represented as: wire c=a & b, then if signal a=0 (the selected signal) then signal "c" (the PRS) is relevantly determined by signal "a" because regardless of the value of b, "c" must be 0. If signal a=1, then signal "c" is relevantly determined only if c=1 and b=1, in which case if "a" is changed to 0, "c" is also changed to 0. If the alternate embodiment is used and if signal a=0 and b=0, the value of signal "a" does not relevantly determine the value of signal "c", because "c" cannot change while "b" is 0. The details are presented in the following table (where T means true and refers to the value 1, and F means false and refers to the value 0, and X means "a" relevantly determine "c" at the same time step).

| a | b | c | One Embodiment | Alternate Embodiment |
|---|---|---|---|---|
| T | T | T | X | X |
| T | F | F |   |   |
| F | T | F | X | X |
| F | F | F | X |   |

If the logic between the selected signal and the PRS is an OR gate which can be represented as: wire c=a|b, then if signal a=1 (the selected signal) then signal "c" (the PRS) is relevantly determined by signal "a" because "c" must be 1. If signal a=0, then signal "c" is relevantly determined only if c=0 and b=0.

| a | b | c | One Embodiment | Alternate Embodiment |
|---|---|---|---|---|
| T | T | T | X |   |
| T | F | T | X | X |
| F | T | T |   |   |
| F | F | F | X | X |

If the logic between the selected signal and the PRS is a NAND gate which can be represented as: wire c=~(a & b), then if signal a=0 (the selected signal) then signal "c" (the PRS) is relevantly determined by signal "a" because "c" must be 1. If signal a=1, then signal "c" is relevantly determined only if c=0 and b=1.

If the logic between the selected signal and the PRS is a NOR gate which can be represented as: wire c=~(a|b), then if signal a=1 (the selected signal) then signal "c" (the PRS) is relevantly determined by signal "a" because "c" must be 0. If signal a=0, then signal "c" is relevantly determined only if c=1 and b=0.

If the logic between the selected signal and the PRS is a NOT gate which can be represented as: wire c=~a, then signal "c" is relevantly determined by signal "a" regardless of the value of "c" or "a."

When the invention considers multi-input logic that have more than two inputs, the determination can be performed in two ways; If a white-box analysis is to be performed, then the multi-input logic can be translated into a netlist of 2-input logic. If black-box analysis is to be performed, the logic can be regarded as a black box and analyzed at the overall relationship between the inputs and the output. For example, let's consider a Multiplexor as a blackbox. If the logic between the selected signal and the PRS is a Multiplexor (MUX) which can be represented as: wire c=s1? a:b, then if signal "a" has value 1 and signal "s1" has value 1, "c" is relevantly determined by "a" because when "a" changes its value from 1 to 0, "c" must also change value from 1 to 0.

| S1 | a | b | c | One Embodiment | Alternate Embodiment |
|---|---|---|---|---|---|
| T | T | T | T | X | X |
| T | T | F | T | X | X |
| T | F | T | F | X | X |
| T | F | F | F | X | X |
| F | T | T | T |   |   |
| F | T | F | F |   |   |
| F | F | T | T |   |   |
| F | F | F | F |   |   |

Alternatively, if a precise analysis is performed by regarding the MUX as a white-box, a MUX can be translated into four logic gates as "c=i1|i2", "i1=a & s1", "i2=b & i3", and "i3=~s1". The intermediate signals "i1", "i2", and "i3" are not signals actually named in the RTL description, but are created either temporarily to facilitate the "because" analysis or permanently during the synthesis process 104. The precise analysis will yield the following result when the value of signal a is highlighted (using the first embodiment in defining relevantly determined). In this table, we determine the values of all intermediate signals first, and then whether the value of "a" relevantly determined the value of signal "i1" (marked as X(a) in the column for i1), and then whether the value of "i1" relevantly determined the value of signal "c" (marked as X(i1) in the column for c. The last column in the table shows whether the value of "a" relevantly determine the value of c.

| S1 | a | b | c | i3 (~s1) | i1 (a & s1) | i2 (b & i3) | C (i1 \| i2) | One embodiment |
|---|---|---|---|---|---|---|---|---|
| T | T | T | T | F | T/X(a) | F | X(i1) | X |
| T | T | F | T | F | T/X(a) | F | X(i1) | X |
| T | F | T | F | F | F/X(a) | F | X(i1) | X |
| T | F | F | F | F | F/X(a) | F | X(i1) | X |
| F | T | T | T | T | F | T |   |   |
| F | T | F | F | T | F | F | X(i1) |   |
| F | F | T | T | T | F/X(a) | T |   |   |
| F | F | F | F | T | F/X(a) | F | X(i1) | X |

If there is a flip flop in addition to logic described above between the selected signal and the PRS, then the value of PRS at the different time step is computed as relevantly determined according to the rules stated above in conjunction with the flop conversion process. The value of the selected signal is sampled at time step t. With the flop conversion process, the value of the target signal that is relevantly determined by the selected signal at the selected time step is sampled at time step t+n, where n is the number of flip flops between the selected signal and the target signal.

Figure 6:
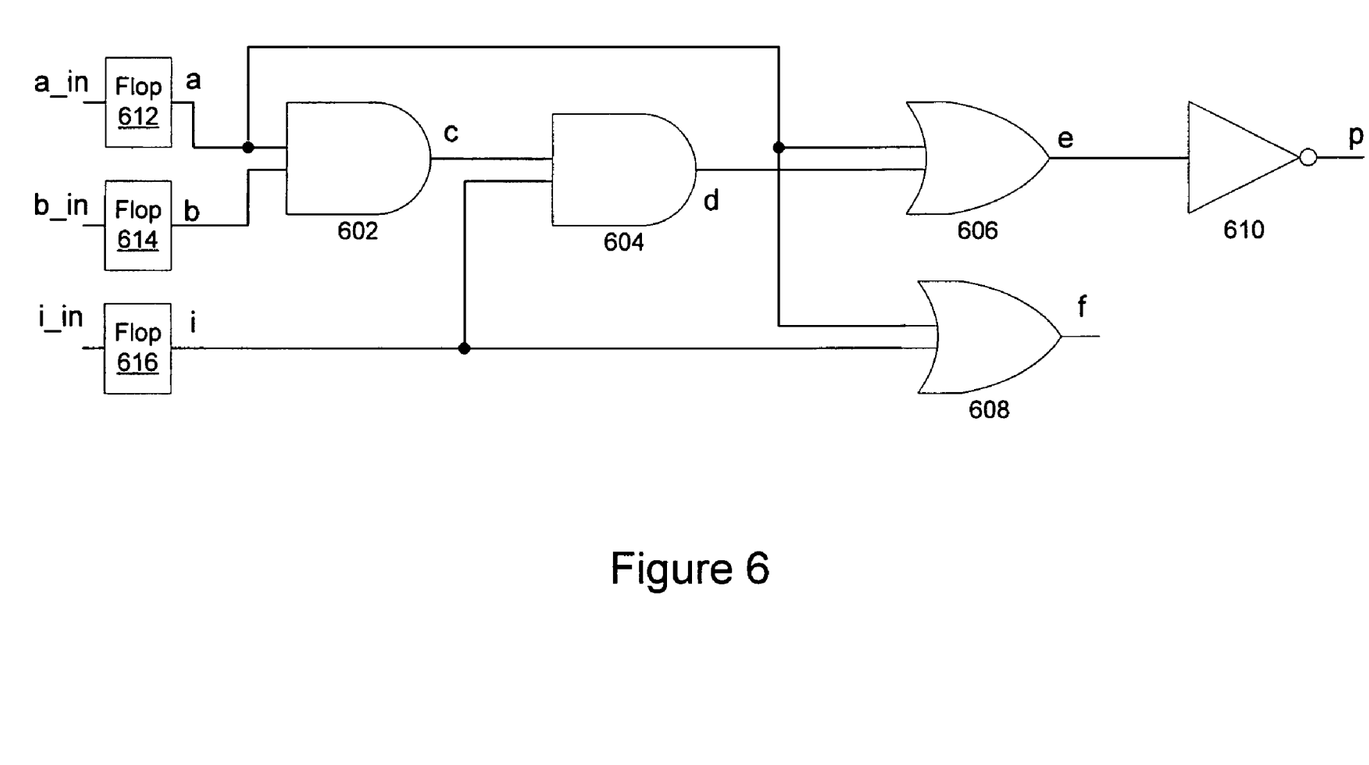
FIG. 6 is a design schematic illustrating one example of the operation of one embodiment of the present invention.

FIG. 6 is a design schematic illustrating one example of the operation of one embodiment of the present invention. FIG. 6 includes three AND gates 602, 604, 608, an OR gate 606, a NOT gate 610, and three flipflops 612, 614, and 616. The design can be represented by the following description:

```
input a_in;
input b_in;
input i_in;
reg a;
reg b;
reg i;
wire c=a & b;
wire d=c & i;
wire e=a|d;
wire f=a|i;
wire p=~e; // the proof target
    always @(posedge clk or negedge rstN) begin
        if (~rstN)
            begin
                a<=1'b0;
                b<=1'b0;
                i<=1'b0;
            end
        else
            begin
                a<=a_in;
                b<=b_in;
                i<=i_in;
            end
    end
endmodule // foo
```

In this example, the assumptions are i_in=0 and b_in=0. The proof target is p==1. This may give the counterexample waveforms set forth in Table 1.

TABLE 1

|   | At time t1 | At time t2 |
|---|---|---|
| A | 0 | 1 |
| B | 0 | 0 |
| I | 0 | 0 |
| C | 0 | 0 |
| D | 0 | 0 |
| E | 0 | 1 |
| F | 0 | 1 |
| P | 1 | 0 |

If we presume that signals "c" and "e" are in the analysis region the steps of determining which PRSs are relevantly determined by the selected signal value, for example, signal "a" at time t1 is as follows. The process determines 206 the RTL load signal. In this example the RTL load signals are "c", "e" and "f" because signal "a" is an input for determining the value of each of these signals. In one embodiment the process identifies the RTL load signals as the set of PRSs and determines 216 which of these signals are relevantly determined by the selected signal ("a") at time t1. The process selects a PRS from the set of PRSs and traverse backward from the selected PRS to analyze the logic driving the selected PRS.

From the three RTL load signals, signal "c", "e", and "f" are relevantly determined from signal "a" at time t1. If any of these values change from 0 to 1, then the value of "a" must also change from 0 to 1. If the value of "a" at time t2 is selected instead, signal "e" and "f" are still relevantly determined from signal "a". However, signal "c" is no longer relevantly determined by the value of signal "a" because the value of "c" can change value from 0 to 1 (by changing the value of "b" to 1) without changing the value of "a".

If the PRS is restricted to RTL load signals in the analysis region then the step of traversing 402 will only select signals "c" and "e." Signal "f" will not be selected, for example, since it is not in the analysis region. As described above, both signal "c" and signal "e" are relevantly determined by signal "a" at t1. However, at t2, only signal "e" is relevantly determined by signal "a".

Figure 3:
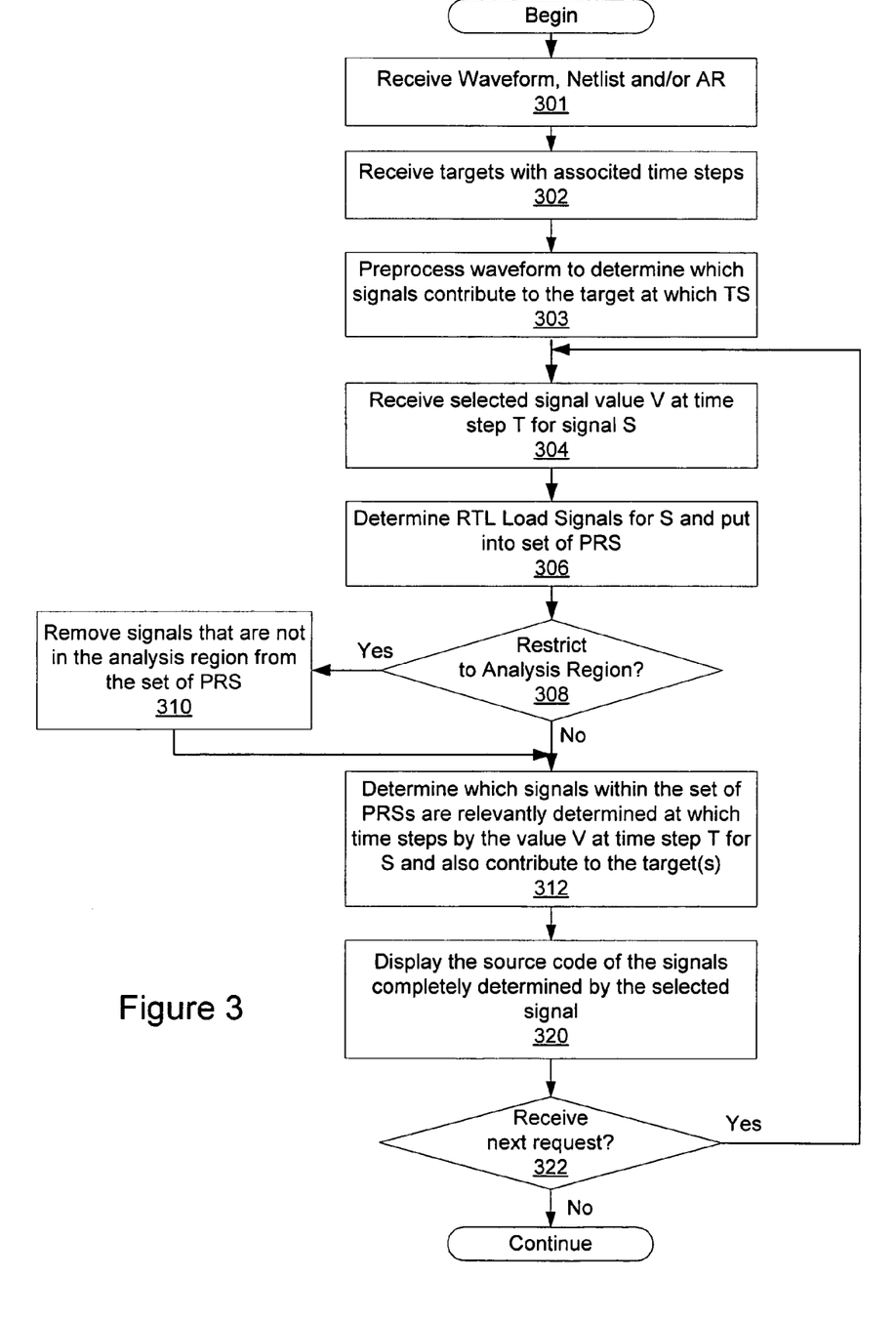
FIG. 3 is a flowchart illustrating a method of the present invention for generating information about values of signals in the analysis region that contribute to the proof target and are relevantly determined by a selected signal value according to one embodiment of the present invention.

As described in greater detail herein, the result of the Because operation when the PRS is the RTL load in the analysis region that contributes to the proof target the result at both t1 and t2 is signal "e". FIG. 3 is a flowchart illustrating how this is determined.

In another embodiment, only signals in the RTL load that contribute to the proof target are identified as PRSs. This process is similar to the process where only signals in the analysis region of the RTL load that contribute to the proof target are identified as PRSs except that the possible set of PRSs are not restricted to signals in the analysis region.

FIG. 3 is a flowchart illustrating a method of the present invention for generating information about signals in the analysis region that contribute to a set of target(s) and whose values are relevantly determined by a selected signal value according to one embodiment of the present invention. Typically the set of targets can be obtained from a simulation test bench as the various coverage point, or from a formal verification process as the proof target or the cover target from a property. The process receives 301 a waveform, netlist and an analysis region (if the analysis region information is necessary), the process receives 302 a set of targets (one or more) with their associated time steps. Then the waveform is preprocessed 303 to determine which signals at which time steps contribute to the target at their associated time steps. This preprocessing 303 is now described with reference to FIGS. 5 and 6.

Figure 5:
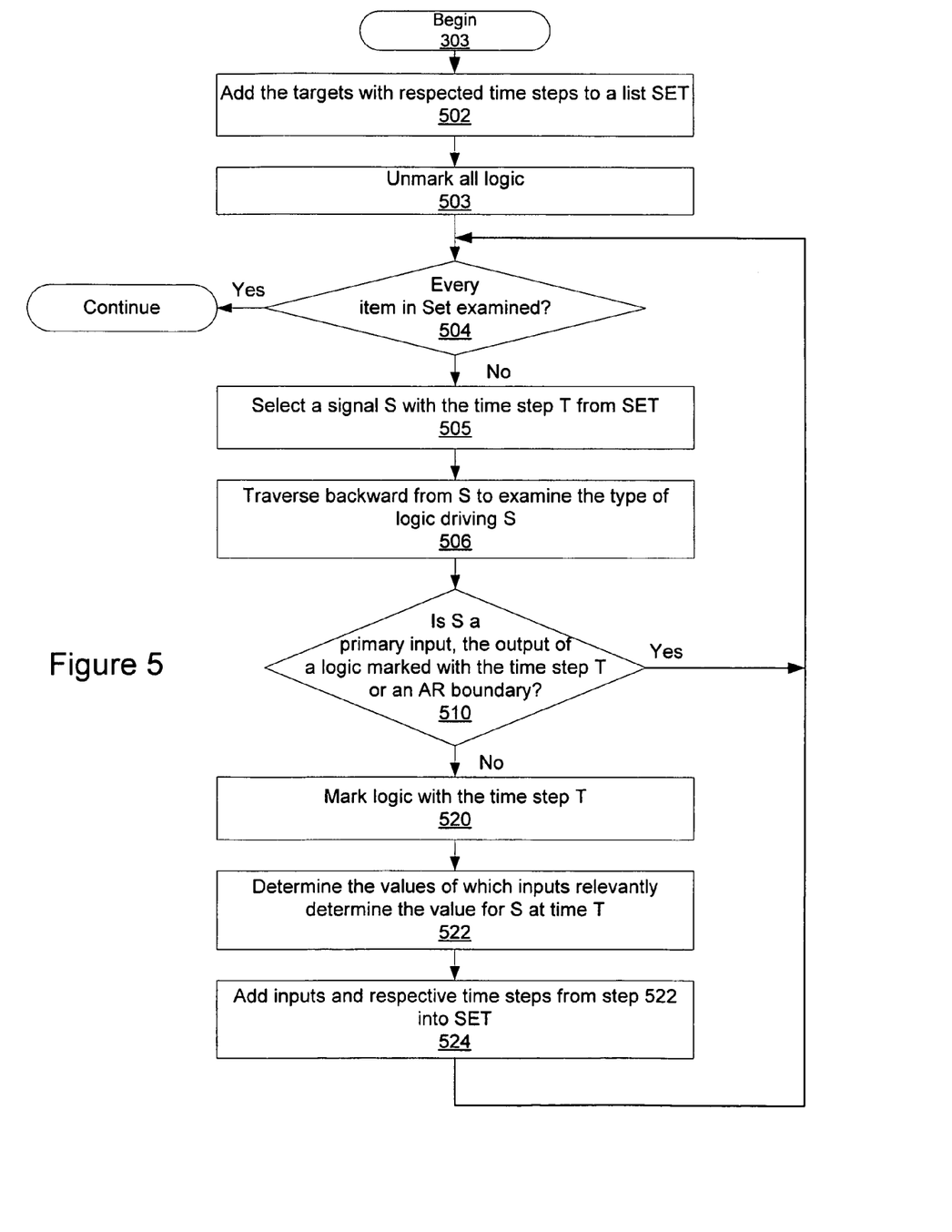
FIG. 5 is a flowchart illustrating the step of preprocessing the trace to determine which signal values contribute to the proof target at a specific time step according to one embodiment of the present invention.

FIG. 5 is a flowchart illustrating the step of preprocessing the trace to determine which signals at which time steps contribute to the targets according to one embodiment of the present invention. Beginning at each target at a specific time step, e.g., signal "p" at time step t2 in FIG. 6, the target signal with the time step t2 is added 502 to the SET that will be traversed. Then the process starts with no marked logic 503, and examines the items in SET until all of the items in SET have been examined 504. It selects 505 an item from the SET and traverses 506 from the output of a gate or a block of logic that drives the selected signal to the inputs of the gate/block. For the example illustrated in FIG. 6, in one embodiment of the present invention the initial signal being examined is signal "p", the traversal backward identifies NOT gate 610. The signal being examined, e.g., signal "p" is checked 510 to see if it is a primary input, if it is the output of a logic that has been marked with the same time step as the current item, or, if analysis region is used, if it is a analysis region boundary signal. If it were, the process would continue by determining 504 whether there are additional signals to examine. Since the signal "p" is not any of those signals, the process proceeds to step 520. In step 520 the process marks the logic with the time step in the current item and then determines 522 which of the input(s) to the logic have a value in some time step that relevantly determines the value of the signal in the current item (the output signal). The process for determining whether the value of an input signal at a specific time step relevantly determines the value of an output signal is described above with reference to FIG. 4. The specific time step for the inputs that relevantly determined the output of the logic are determined by how many flops are presented in the logic being considered, as described above with respect to FIG. 4. Those inputs whose values at specific time steps relevantly determine the value of the output are added 524 to the list SET, together with their respective time step determined in step 522) that will be examined later. The step 522 extracts the inputs that relevantly determine the signal at the time step specified in the current item by executing the steps in FIG. 4 with each input with appropriate time steps as the selected signal and with the signal in the current items as the set PRSs.

The process continues by determining 504 whether any item in the set SET in the list of signals have not been examined. If there are additional items, one item is chosen and the process continues with step 506. If all items in the list have been examined then the items in the list represent those signals whose values at the specified time steps contribute to the target(s).

As an example, for the circuit illustrated in FIG. 6, the preprocessing step adds 502 signal "p" with the current time step t2 to the list SET to be checked. Then the process traverses 506 backward to NOT gate 610. The signal being examined, signal "p", is not a primary input 510, an analysis region boundary signal 512, or an output of marked logic with the time step t2 514. The NOT gate 610 is then marked with time step t2 520 and the process determines 522 whether the input signal to the NOT gate, signal "e" relevantly determines the signal being examined. In this example, as described above, the input of a NOT gate always relevantly determines the output, so signal "e" with time step t2 is added 524 to the list SET to be examined. Since there is an additional item in SET to be examined 540 the process continues with the next item, i.e., signal "e" with time step t2.

The process traverses 506 the logic and identifies OR gate 606. The signal being examined, signal "e", is not a primary input 510, an analysis region boundary signal 512, an output of marked logic with the current time step t2 514. The OR gate 606 is marked with time step t2 520 and the process determines 522 which inputs relevantly determine the value of the output. The values of the signals are known based upon the waveform and thus, since signals "e" and "a" are one and signal "d" is zero, only the value of signal "a" at time step t2 relevantly determines the value of signal "e" at time step t2. Signal "a" with the time step t2 is added to the list SET for future examination and since additional items are in the list 540 the process continues by traversing backward from signal "a." The signal "a" is not a primary input 510, analysis region boundary signal 512, or an output of marked logic with time step t2 514. The register is marked with time step t2 520, and the process determines 522 that the value of the signal a_in in time step "t2−1" determines the value of the output "a" at time step t2. Since signal "a_in" is a primary input 510, the process continues by determining 540 whether any unexamined signals are in the list. Since there are not, the process continues and those items in the list, i.e., signals "p", "e", "a" at time step t2 and "a_in" at time step t1=t2−1 are identified as those that contribute to the proof target.

The process continues by identifying 304 in FIG. 3 the selected signal at a specific time step, which can be selected by the user. The process continues by determining 306 the RTL load signal of the selected signal. If analysis region is used 308, the process determines 310 the signals within the RTL load that are in the analysis region, using the process described above, for example. Then the process determines 312 which signals at which specific time steps within the analysis region of the RTL load also contribute to the proof target. This can be done by the steps described in FIG. 4 and then selecting the intersection of the set of items from FIG. 4 and the set of items from step 303. Or it can be done by reusing the info cached during 303, since the steps in FIG. 4 have been executed in step 522 for those outputs that may contribute to the targets. In one embodiment this determination is accomplished using the process described above with respect to FIG. 4. In the example set forth in FIG. 6, the preprocessing step 303 identified signals "a_in" at time step t1, and "a", "e", and "p" at time step t2 as the only items that contribute to the proof target. Consistent with the previous example, with the selected item being "a" at time t1 the process determines 206 the RTL load signals (signals c, e, and f) and then identifies 210 which signals in the RTL load are also in the analysis region. The result is signals "c" and "e". Then the process determines 312 which signals within the analysis region of the RTL load have values at specific time steps that also contribute to the proof target. This results in the set of potentially relevant signals (PRSs) being only signal "e". Then the process continues by determining whether the signal in the PRS set, signal "e", is relevantly determined by signal "a". Signal "e" is relevantly determined by signal "a" and is so identified. If another request is received 322, the process continues.

After determining 312 which of the PRSs are relevantly determined by the selected signal, information, e.g., the source code, of such relevantly determined signals are displayed 320 to the user. In one embodiment the exact lines and columns in the source code responsible for the value assignment of the relevantly determined signals at the specified time steps are highlighted on a display. The user can select a signal in the source code by, for example, double clicking on the signal, to invoke the Because feature from the display of the source code. The signal which has been double clicked in the source code view is the selected signal with the specific time step that causes the specific value to be assigned in the originally selected item. After the Because feature is invoked, the updated information is displayed to the user.

Figure 7:
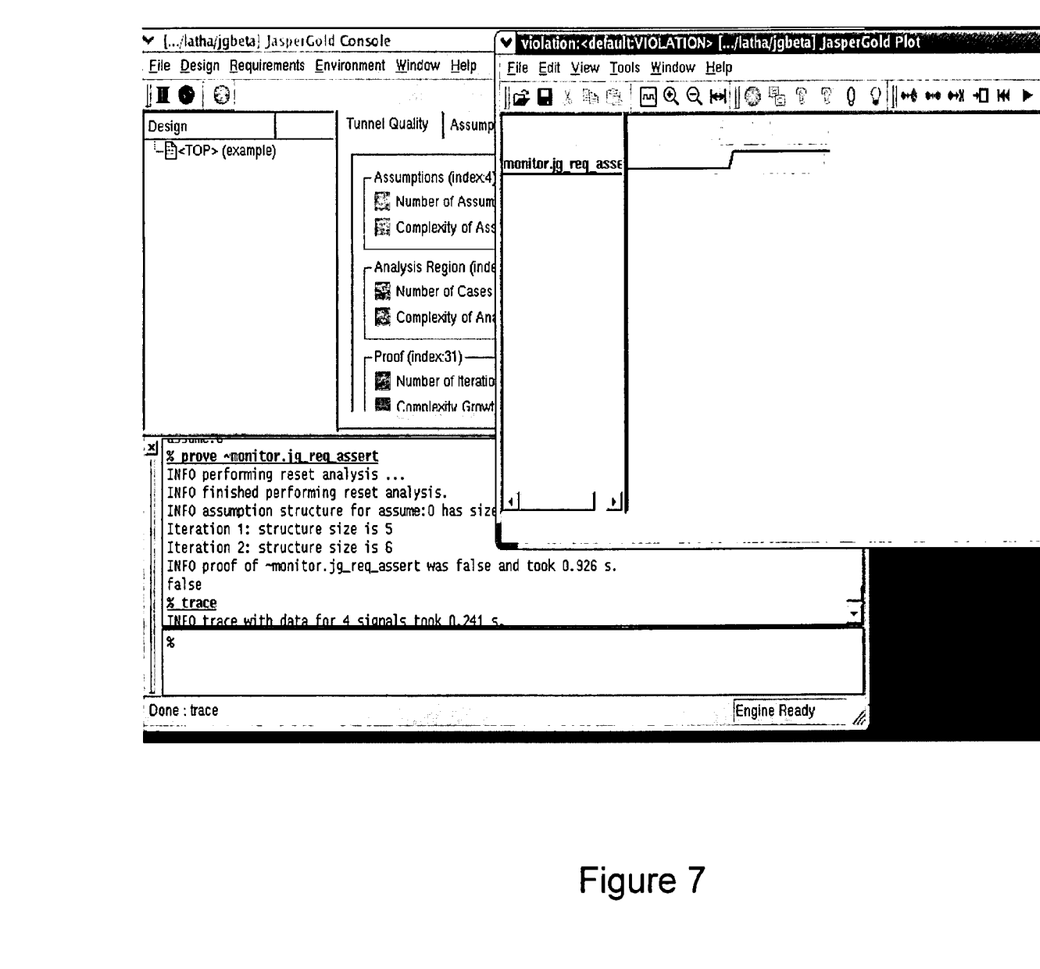
FIG. 7 is a graphical user interface illustrating a waveform of a counterexample according to one embodiment of the present invention.

FIGS. 7-12 are illustrations of graphical user interfaces according to one embodiment of the present invention. FIG. 7 is a graphical user interface illustrating a waveform of a counterexample according to one embodiment of the present invention. This may be presented to the user after the counterexample waveform is generated in step 202, for example.

Figure 8:
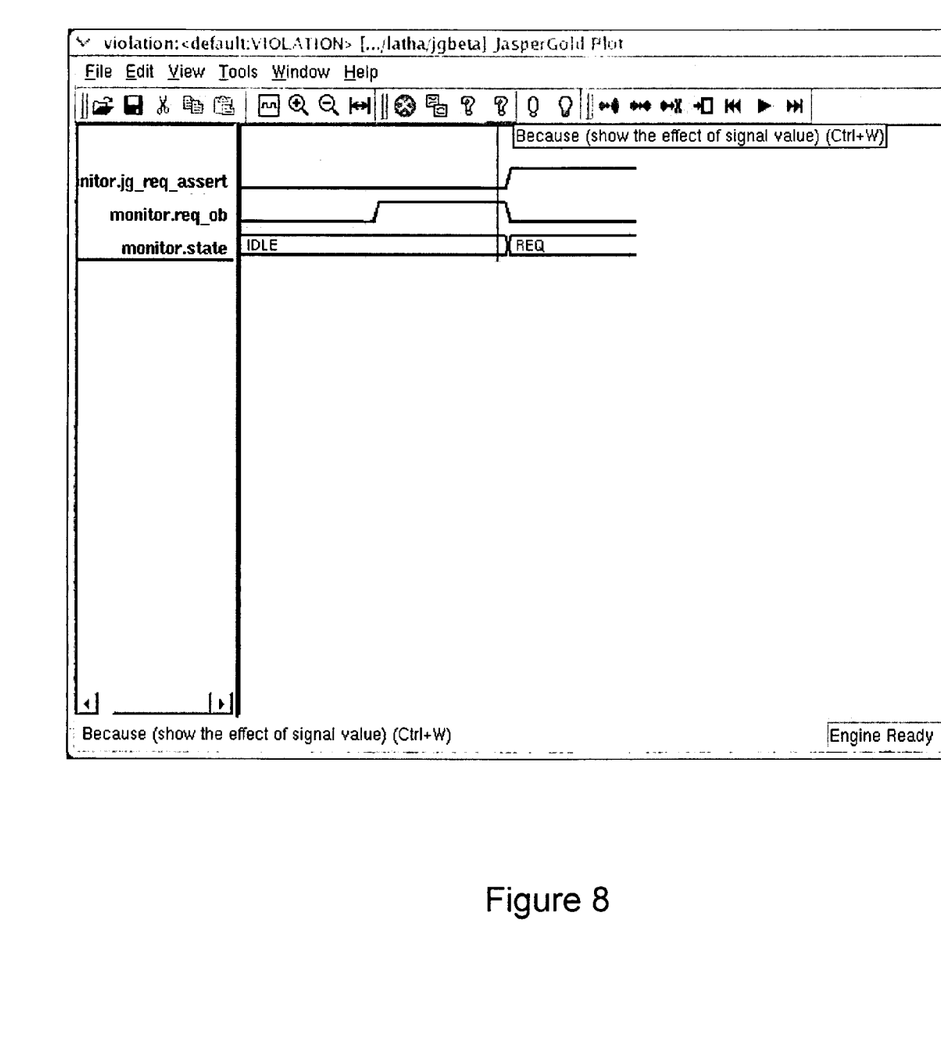
FIG. 8 is a graphical user interface illustrating a user selection of the value of a signal at a specific time step within a waveform of a counterexample according to one embodiment of the present invention.
Figure 10:
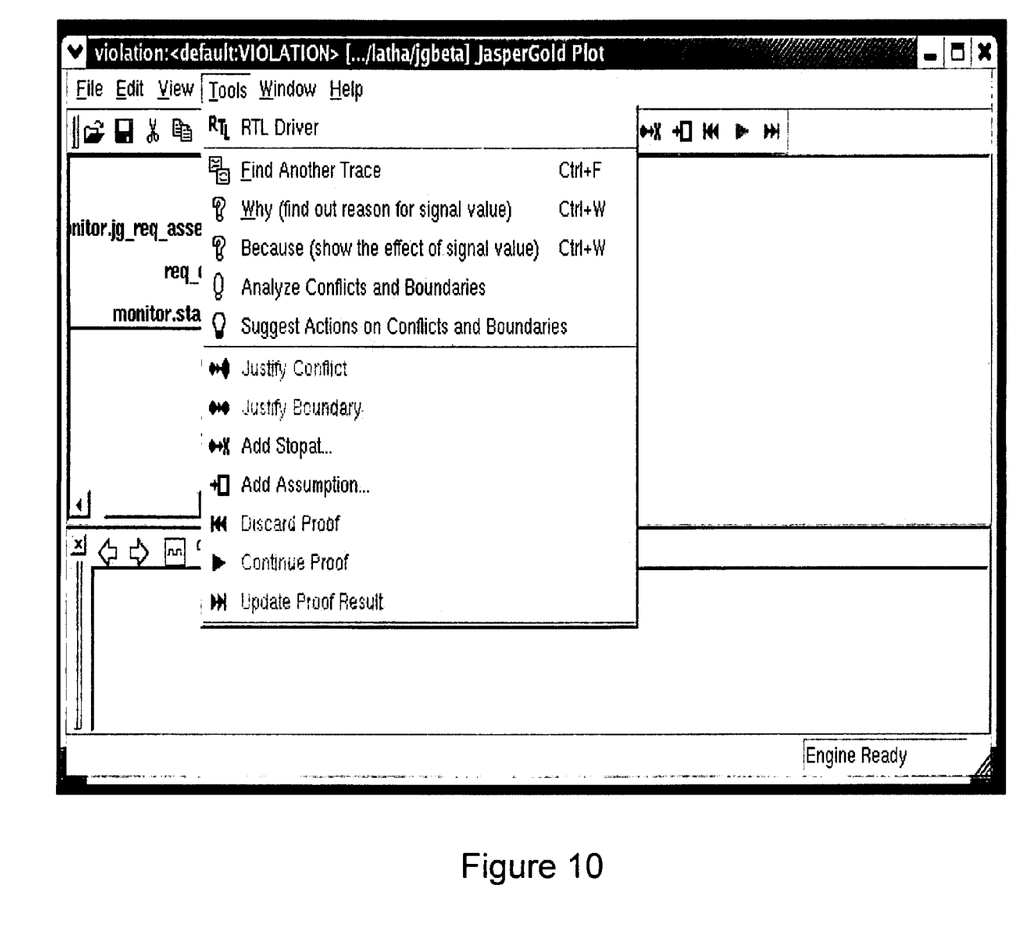
FIG. 10 is a graphical user interface illustrating the selection of the "Because" feature according to one embodiment of the present invention.

FIG. 8 is a graphical user interface illustrating a user selection of a waveform from a counterexample according to one embodiment of the present invention. In this example the user identifies 204 the selected signal, e.g. "monitor.req.ob" at time step 1. One way to identify the signal is to highlight the signal value at time step 1 and then select a "Because" icon on the monitor or in a drop down menu, for example. An example of a drop down menu is illustrated in FIG. 10. FIG. 10 is a graphical user interface illustrating the selection of the "Because" feature according to one embodiment of the present invention.

Figure 9A:
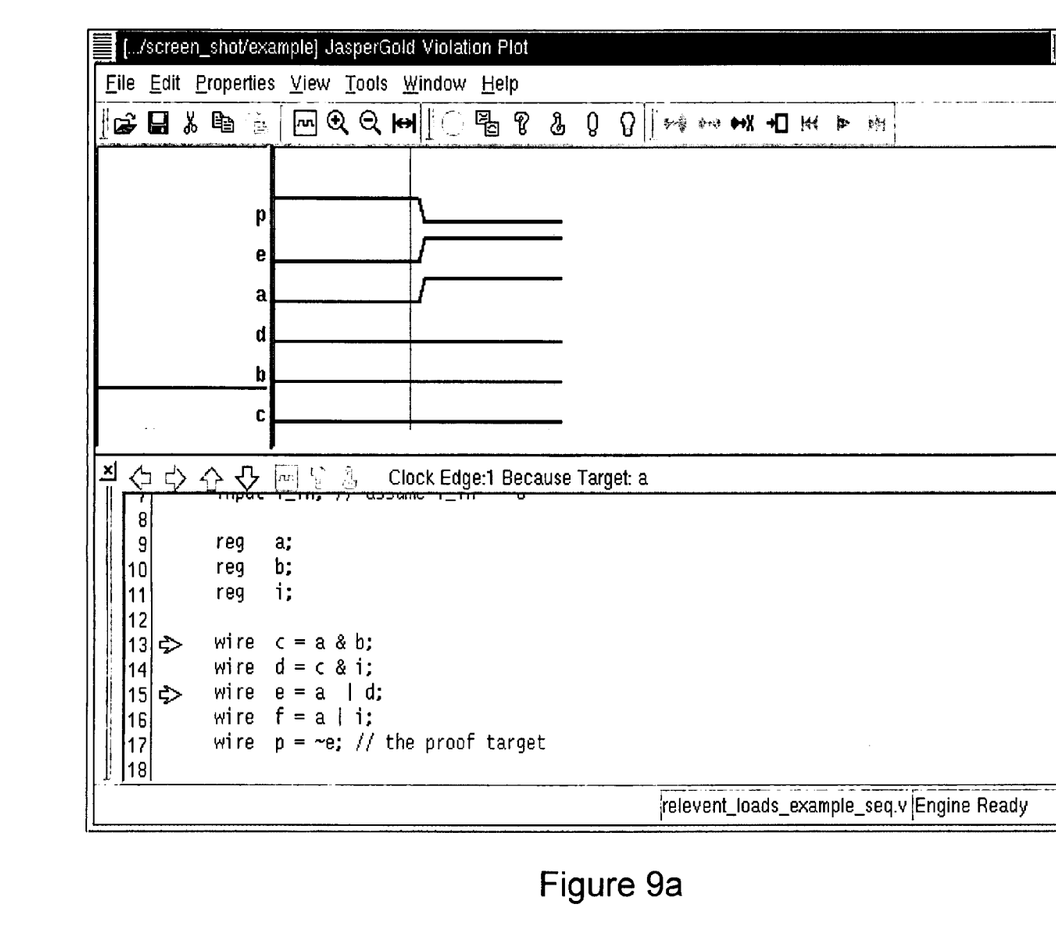
FIGS. 9a and 9b are a graphical user interface illustrating signals in the analysis region whose values are relevantly determined by the selected signal according to one embodiment of the present invention.
Figure 9B:
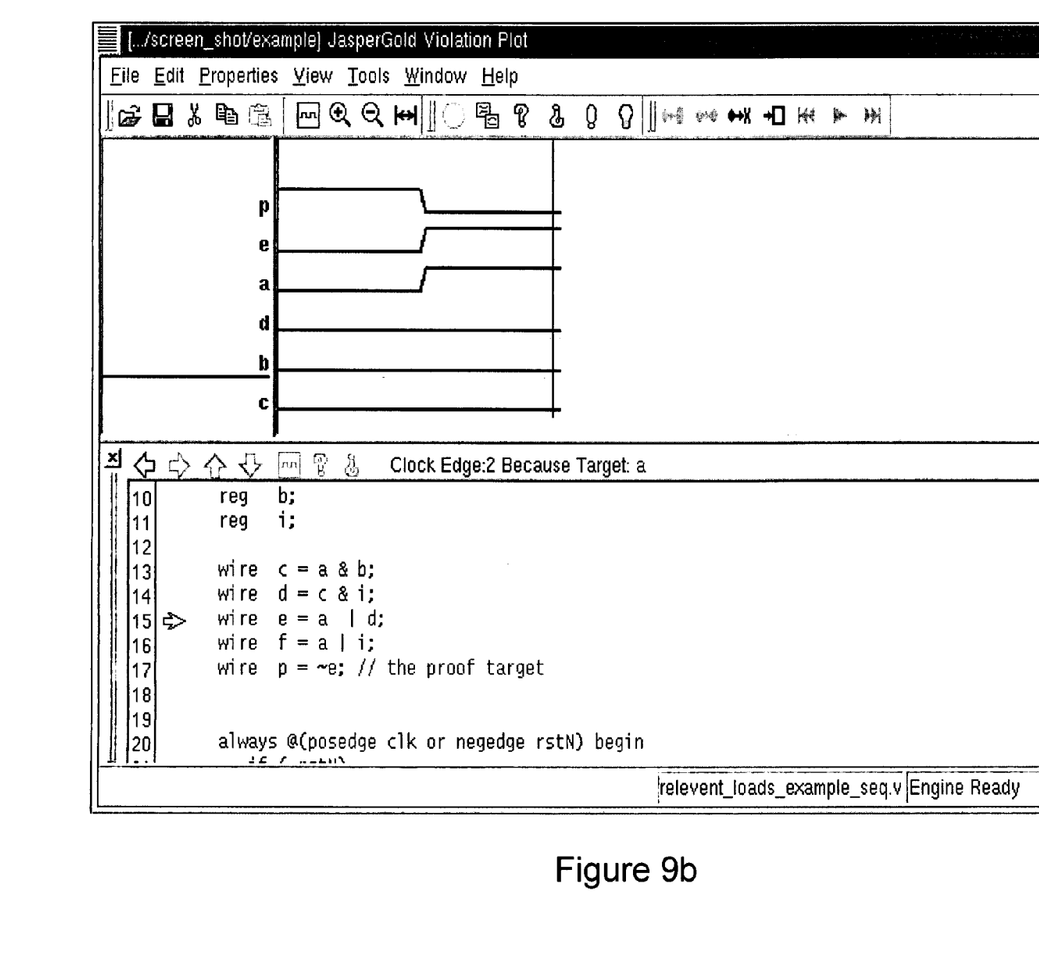

FIG. 9 is a graphical user interface illustrating signals in the analysis region that are relevantly determined by the selected signal at the selected time step and according to one embodiment of the present invention. In FIG. 9a, the selected signal is "a" at time step 1, whose value is 0 at clock edge 1. Since the value of "a" at time step 1 relevantly determine the values of "c" and "e" at time step 1, after selecting the "Because" feature, the results, the exact lines in which "c" and "e" are assigned the relevantly determined values are marked by the arrow in the source code view. In FIG. 9b, the selected signal is "a" at time step 2, whose value is 1 at clock edge 2. After selecting the "Because" feature, the result, the exact line in which "e" is assigned the relevantly determined values is marked by the arrow. The exact lines and columns for the reference to "a" in determining the value of "e" is highlighted.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claims.

What is claimed is:

1. A computer based method for identifying relevant signals in a circuit model in a verification environment comprising steps of:
   receiving a trace corresponding to the circuit model;
   receiving a selected signal at a selected time step in said trace;
   determining an RTL load signal set for said selected signal, said RTL load signal set representing fan-out signals of said selected signal; and
   identifying a set of relevant signals, each relevant signal with one or more associated time steps, including one or more signals from said RTL load signal set, where value of said each relevant signal at each associated time step is relevantly determined by said selected signal at the selected time step.

2. The method of claim 1, wherein said each relevant signal is relevantly determined by said selected signal at the selected time step when the value of the selected signal at the selected time step changes the value of the said each relevant signal must change, or when value of the selected signal does not change, the value of the said each relevant signal cannot change.

3. The method of claim 1, wherein said each relevant signal is relevantly determined by said selected signal if the value of said each relevant signal in the set of relevant signals must change when value of the selected signal at the selected time step changes.

4. The method of claim 1, wherein said identifying a set of relevant signals further comprising steps of:
   selecting a test signal within said RTL load signal set;
   identifying a first portion of logic from which the test signal is output if said selected signals is one of inputs to said first portion of logic; and
   applying a first set of rules on one or more circuit elements within said first portion of logic to identify whether the selected value of said selected signal at a first time relevantly determines said output of said first portion of logic.

5. The method of claim 1, further comprising a step of:
   displaying said set of relevant signals.

6. The method of claim 1, further comprising a step of displaying exact lines and columns in a source code that correlate to specific value assignments to said set of relevant signals.

7. A computer based method for identifying relevant signals in a circuit model in a verification environment comprising steps of:
   receiving a trace corresponding to the circuit model;
   receiving a selected signal at a selected time step in said trace;
   determining an RTL load signal set for said selected signal, said RTL load signal set representing fan-out signals of said selected signal;
   identifying a second set of signals, each relevant signal with one or more associated time steps, corresponding to signals within a first set of signals whose values at the associated time steps contribute to a non-empty set of targets; and
   identifying a set of relevant signals, each relevant signal with one or more associated time steps, including one or more items from said second set of signals, where value of said each relevant signal at each associated time step is relevantly determined by said selected signal at the selected time step.

8. The method of claim 7, wherein said each relevant signal is relevantly determined by said selected signal at the selected time step when either value of the selected signal at the selected time step changes the value of said each relevant signal must change, or when the value of the selected signal does not change, the value of said each relevant signal cannot change.

9. The method of claim 7, wherein said each relevant signal is relevantly determined by said selected signal if the value of said each relevant signal in the set of relevant signals must change when value of the selected signal at the selected time step changes.

10. The method of claim 7, wherein said identifying a set of relevant signals further comprising steps of:
    selecting a test signal within said RTL load signal set;
    identifying a first portion of logic from which the test signal is output if said selected signal is one of inputs to said first portion of logic; and
    applying a first set of rules on one or more circuit elements within said first portion of logic to identify whether the selected value of said selected signal at a first time relevantly determines said output of said first portion of logic.

11. The method of claim 7, further comprising a step of:
    displaying said set of relevant signals.

12. The method of claim 7, further comprising a step of displaying exact lines and columns in a source code that correlate to specific value assignments to said set of relevant signals.

13. A computer based method for identifying relevant signals in a circuit model in a verification environment comprising steps of:
    receiving a trace corresponding to the circuit model;
    receiving a selected signal at a first time in said trace;
    determining an RTL load signal set for said selected signal, said RTL load signal set representing fan-out signals of said selected signal;
    identifying a second set of signals corresponding to signals within said RTL load signal set that are in the analysis region;
    identifying a third set of signals, each of said third set of signals with one or more associated time steps, corresponding to signals within said second set of signals whose values at their associated time steps contribute to a non-empty set of targets; and
    identifying a set of relevant signals, each relevant signal with one or more associated time steps, including one or more items from said third set of signals, where value of said each relevant signal at each of the associated time step is relevantly determined by said selected signal at the selected time step.

14. The method of claim 13, wherein said each relevant signal is relevantly determined by said selected signal at the selected time step when either value of the selected signal at the selected time step changes the value of the said each relevant signal must change, or when the value of the selected signal does not change, the value of the said each relevant signal cannot change.

15. The method of claim 13, wherein said each relevant signal is relevantly determined by said selected signal if the value of the signal in the set of relevant signals must change when the value of the selected signal at the selected time step changes.

16. The method of claim 13, wherein said identifying a set of relevant signals further comprising steps of:

selecting a test signal within said RTL load signal set;

identifying a first portion of logic from which the test signal is output if said selected signals is one of inputs to said first portion of logic; and     applying a first set of rules on one or more circuit elements within said first portion of logic to identify whether the selected value of said selected signal at a first time relevantly determines said output of said first portion of logic.

17. The method of claim 13, further comprising a step of: displaying said set of relevant signals.

18. The method of claim 13, further comprising a step of displaying exact lines and columns in a source code that correlate to specific value assignments to said set of relevant signals.

19. The method of claim 13, further comprising a step of: preprocessing said trace to identify one or more signals with associated time steps, where the values of each signal at the associated time steps contribute to a proof target.

* * * * *